United States Patent
Wakai

(10) Patent No.: US 7,184,911 B2
(45) Date of Patent: Feb. 27, 2007

(54) DETERMINATION APPARATUS AND METHOD OF CALIBRATING THE APPARATUS

(75) Inventor: Ryohei Wakai, Hyogo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/508,373

(22) PCT Filed: Mar. 27, 2003

(86) PCT No.: PCT/US03/09574

§ 371 (c)(1), (2), (4) Date: Mar. 24, 2005

(87) PCT Pub. No.: WO03/083907

PCT Pub. Date: Oct. 9, 2003

(65) Prior Publication Data
US 2005/0165570 A1    Jul. 28, 2005

(30) Foreign Application Priority Data
Mar. 29, 2002  (JP) .......................... 2002/096099

(51) Int. Cl.
*G01R 31/00* (2006.01)

(52) U.S. Cl. ..................................... 702/107

(58) Field of Classification Search ................. 702/127, 702/107
See application file for complete search history.

(56) References Cited

U.S. PATENT DOCUMENTS

| | | | |
|---|---|---|---|
| 4,816,767 A | | 3/1989 | Cannon et al. |
| 4,982,164 A | | 1/1991 | Schiek et al. |
| 5,047,725 A | * | 9/1991 | Strid et al. ................. 324/601 |
| 5,440,236 A | * | 8/1995 | Schiek et al. ............... 324/601 |
| 5,552,714 A | | 9/1996 | Adamian et al. |

(Continued)

OTHER PUBLICATIONS

"*Agilent Technologies 8712ES and 8714ES RF Network Analyzers*," User's Guide Agilent Technologies; Jun. 2000; 38 pps.

(Continued)

*Primary Examiner*—Michael Nghiem
*Assistant Examiner*—Demetrius Pretlow

(57) ABSTRACT

There is provided a determination apparatus. The determination apparatus includes (a) a determination device having a plurality of determination terminals, (b) a controller for selecting at least one of the plurality of determination terminals, determining a calibration reference standard, and setting of a property value of the determined calibration reference standard, and (c) a memory for storing a parameter of the determined calibration reference standard and a determined value for the parameter as determined by the determination device. The determination device determines an error of the determined value of the parameter, the error being stored in the memory, the determination device outputting the determined value after removing an effect of the error therefrom, and obtaining and storing a re-determined value for the parameter while maintaining the determined value of the parameter of the calibration reference standard in the memory.

12 Claims, 9 Drawing Sheets

U.S. PATENT DOCUMENTS

| | | | |
|---|---|---|---|
| 5,715,183 A * | 2/1998 | Grace et al. ................. | 702/85 |
| 5,734,268 A | 3/1998 | Bockelman | |
| 5,784,299 A * | 7/1998 | Evers et al. ................. | 702/85 |
| 5,825,669 A * | 10/1998 | Oldfield et al. .............. | 702/85 |
| 6,147,501 A | 11/2000 | Chodora | |
| 6,300,775 B1 * | 10/2001 | Peach et al. ............... | 324/601 |
| 6,417,674 B1 * | 7/2002 | Rowell et al. .............. | 324/601 |
| 2004/0160228 A1 * | 8/2004 | Jamneala et al. ........... | 324/601 |

OTHER PUBLICATIONS

Goldberg et al., "*Accurate Experimental Characterization of three-ports,*" Microwave Symposium Digest, New York, NY; Jun. 10, 1991; p. 241-244.

European Search Report from Corresponding EP Application No. 03718093.2; Dated Sep. 21, 2006.

\* cited by examiner

DETERMINATION APPARATUS AND METHOD OF CALIBRATING THE APPARATUS

FIELD OF THE INVENTION

The present invention relates to a determination apparatus comprising a calibration function, and in particular pertains to a determination apparatus having two or more determination electrodes with which work efficiency is improved during calibration.

BACKGROUND OF THE INVENTION

Many determination apparatuses have imperfections, including deviations between the determined values of these apparatuses and the actual values. Therefore, determination apparatuses are produced such that the determination apparatus is calibrated prior to determination of a device under test (DUT hereinafter), so that the effects of systematic error can be removed from the determined value. Systematic error is hereinafter referred to as error and error coefficient.

A conventional calibration method and its procedure will now be described using a network analyzer as an example of the determination apparatus.

FIG. 1 is a schematic drawing of a two-port network analyzer 100. Network analyzer 100 comprises a CPU 120, a memory 130, which is an example of a memory, an input device 140, a determination device 150, and a display 160, which is an example of an output means. Furthermore, these structural elements are connected together by a bus 110. CPU 120 exchanges data with memory 130, input device 140, determination part 150, or display part 160 and processes the data as needed. Memory 130 stores information on settings for network analyzer 100, determined values obtained by determination device 150, etc. Input device 140 receives commands from outside network analyzer 100. Determination device 150 has a port A and a port B that are the determination terminals, and determines the incident signal power and reflected signal power. Furthermore, the incident signals are output signals at the ports and the reflected signals are input signals at the ports.

A two-port device is connected between port A and port B of this type of network analyzer 100. When the forward and backward network properties of this device are determined, there are 12 systematic errors present related to signal leak, signal reflection, and frequency response.

The TRL (Through-Reflect-Line) calibration method is one calibration method whereby the effect of these errors is removed from the determined values. The TRL calibration method is characterized in that three types of calibration reference standards are used through a reflect, and a line standard. It is possible to remove the effects of ten errors with two-port calibration, and it can be used for non-coaxial environments and on-wafer determinations. Furthermore, the reflect reference standard is either an open reference standard or a short reference standard.

FIG. 2 is a flow chart showing the procedure of the TRL calibration method as conducted with network analyzer 100. In step P21, data from input device 140 are received and property values are set for the calibration reference standard that will be used in calibration. Incidentally, both port A and port B are used to determine the calibration reference standards. In step P22, determination part 150 determines the calibration reference standard connected to port A and port B and CPU 120 receives these determined values from determination device 150 and stores them in memory 130.

By means of the TRL calibration method, it is necessary to determine 12 parameters of the calibration reference standard in the case of two-port calibration. Consequently, processing is performed in step P23 to decide whether or not all of these determined values have been obtained. Step P22 is repeated until all determined values are obtained.

Moreover, in step P24, CPU 120 references the determined values of 14 parameters, finds the values of 10 errors, and stores these error values in memory 130 as error coefficients. Finally, the determined values of the 14 parameters stored in the memory are erased. Network analyzer 100 can output determined values of the DUT, wherein the effects of the errors found have been removed (i.e., the corrected determined values) after calibration by the above-mentioned procedure.

However, there are cases in which it is impossible to accurately find the error due to poor connection of calibration reference standards or mis-connection of calibration reference standards attributed to the number of determination terminals, etc., after calibration has been performed and the calibration reference standard must therefore be re-determined. Whether or not the error has been accurately found can be confirmed by observing the corrected determined values. However, according to the conventional procedure, the corrected determined values can only be observed after calibration. Once calibration has been performed, all of the determined values for the parameters of the calibration reference standards are erased and the specific parameter values have to be re-determined to confirm accuracy thereof, resulting in poor calibration work efficiency. In recent years, the number of ports in the determination devices and DUTs has increased and as a result, the time for re-calibration has increased. This problem is significant.

SUMMARY OF THE INVENTION

The object of the present invention is to solve the above-mentioned problems of the prior art, its object being to reduce the number of processes when re-determination of calibration reference standards is necessary by outputting the determined values of desired parameters from which the effects of error have been removed during calibration work.

Moreover, another object is to prevent the waste of memory resources when determined values of the parameters of calibration reference standards are stored and to prevent workers from being confused by the co-existence of newly determined values and old determined values when calibration is performed again by rendering the determined values of the parameters of calibration reference standards unusable when calibration is interrupted or terminated.

Yet another object is to make it easy to verify error coefficients obtained by calibration and to respond when poor error coefficients are obtained when N number of the determination terminals are to be calibrated by calibrating determination terminals for each combination of determination terminals obtained by selecting M number of determination terminals less than N from N number of the determination terminals.

DESCRIPTION OF THE PREFERRED EMBODIMENT

A first embodiment of the present invention is a method of calibrating a determination apparatus having determination terminals and a memory. The method of calibration includes removing the effects of an error from the desired determined value of a desired parameter and outputting the determined value and using a calibration reference standard with which, the desired parameter of the calibration reference standard can be re-determined. The re-determined value can be stored in the memory means while keeping as is the determined value of the parameter of the stored calibration reference standard.

Moreover, by means of a second object of the invention the determined value of the parameter of the calibration reference standard is rendered unusable when calibration is interrupted or terminated.

Furthermore, the third object of the invention is a method of calibrating a determination device comprising determination terminals using a calibration reference standard with which when the N number of the determination terminals are to be calibrated, determination terminals are calibrated for each combination of determination terminals obtained by selecting M number of determination terminals less than the N from N number of the determination terminals.

The present invention will now be described based on the exemplary determination device shown in the attached drawings. The example is a four-port network analyzer calibrated by the method of the present invention. An illustrative schematic drawing is shown in FIG. 3.

Figure 1:
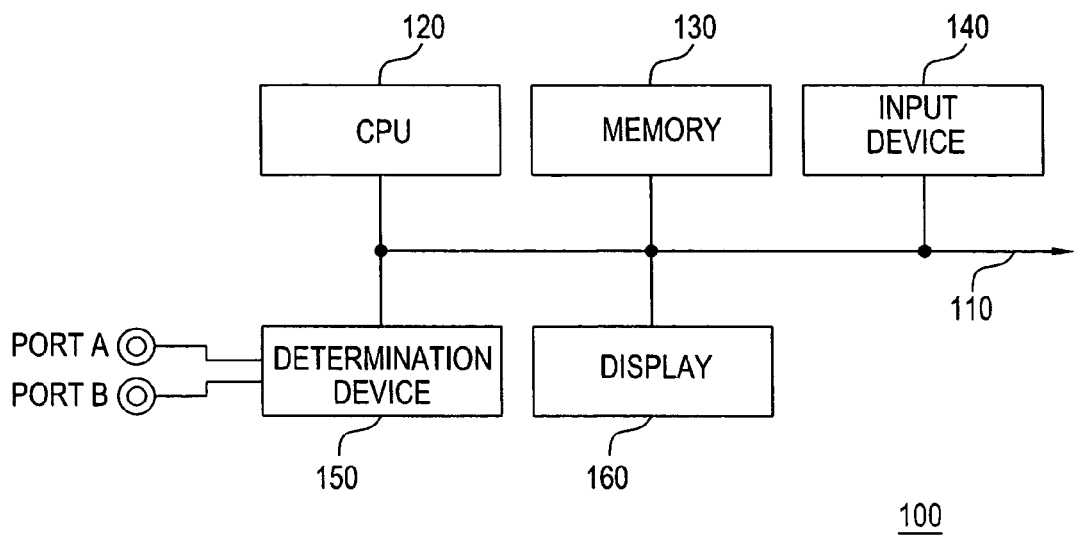
FIG. 1 is a schematic drawing of a network analyzer capable of calibration by conventional methods.
Figure 2:
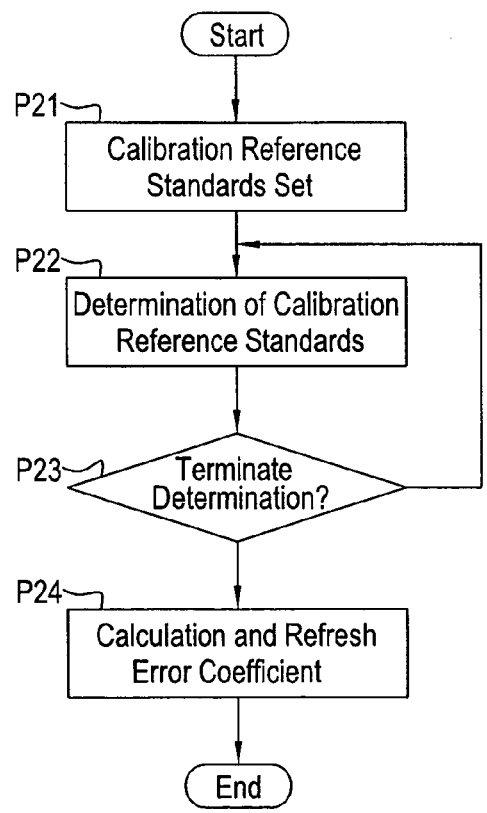
FIG. 2 is a flow chart showing the calibration procedure by a conventional method.
Figure 3:
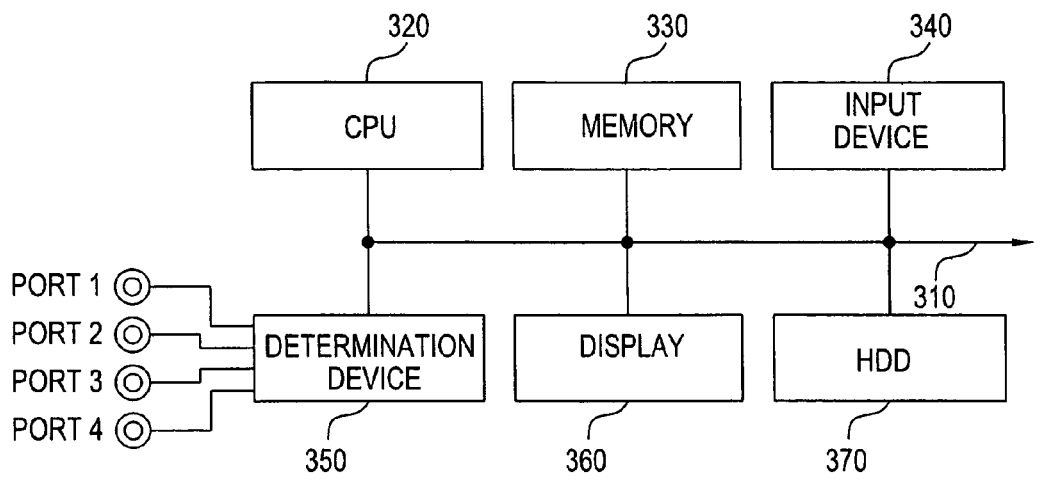
FIG. 3 is a schematic drawing of a network analyzer capable of calibration by the method of the present invention.

Network analyzer 300 in FIG. 3 is an example of a determination apparatus. It comprises a CPU 320, which is an example of a controller; a memory 330, an example of a memory means; input device 340; a determination device 350, an example of a determination means; a display 360, an example of an output means, and a hard disk drive 370 (HDD hereinafter), an example of a recording medium.

Furthermore, these structural units are connected by a bus 310. CPU 320 controls determination device 350 and display 360, etc., and calibrates network analyzer 300 by performing the calibration program read from HDD 370. Memory 330 stores the information on settings of network analyzer 300 and determined values obtained by determination device 350, etc. Although not illustrated, a keyboard or mouse, etc., is connected and input device 340 receives commands from the outside. Determination device 350 comprises port 1, port 2, port 3, and port 4 that are examples of determination terminals used for determining incident signal power and reflected signal power at each port.

Figure 4:
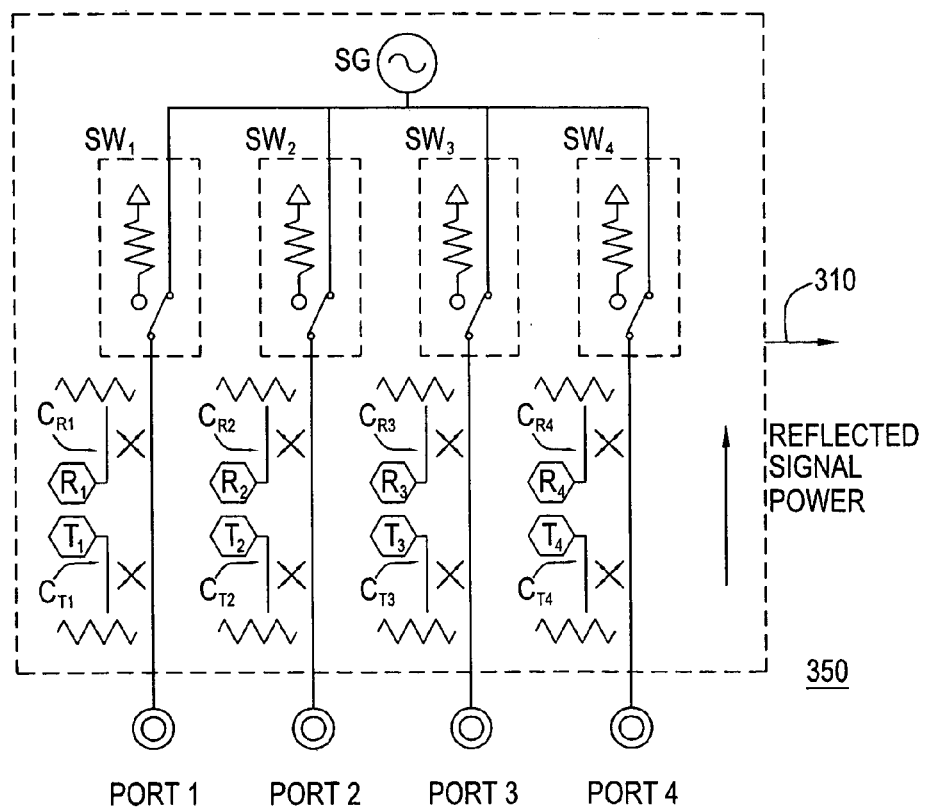
FIG. 4 is a drawing showing an exemplary detailed internal structure of the determination device of a network analyzer capable of calibration by the method of the present invention.

An illustrative drawing of the internal structure of determination device 350 is shown in FIG. 4. Determination device 350 comprises signal source generator SG; switches $SW_1$, $SW_2$, $SW_3$, and $SW_4$, reference receivers $R_1$, $R_2$, $R_3$ and $R_4$ for determining reflected signal power; and test receivers $T_1$, $T_2$, $T_3$, and $T_4$ for determining incident signal power.

Signal generator SG outputs the base signals for determination. The amplitude and frequency of these output signals are variable.

Switch $SW_1$ is connected to signal generator SG and port 1, and either directs port 1 to signal generator SG or terminates port 1. Switch $SW_2$ is connected to signal generator SG and port 2, and either directs port 2 to signal generator SG or terminates port 2. Switch $SW_3$ is connected to signal generator SG and port 3, and either directs port 3 to signal generator SG or terminates port 3. Switch $SW_4$ is connected to signal generator SG and port 4, and either directs port 4 to signal generator SG or terminates port 4. The switches operate so that when one switch directs a port to signal generator SG, the other three switches terminate the ports.

Test receiver T1 is connected to port 1 with directional coupler $C_{T1}$ therebetween and determines incident signal power at port 1. Reference receiver $R_1$ is connected to port 1 with directional coupler $C_{R2}$ therebetween and determines reflected signal power at port 1. Test receiver $T_2$ is connected to port 2 with directional coupler $C_{T2}$ therebetween and determines incident signal power at port 2. Reference receiver $R_2$ is connected to port 2 with directional coupler $C_{R2}$ therebetween and determines reflected signal power at port 2. Test receiver $T_3$ is connected to port 3 with directional coupler $C_{T3}$ therebetween and determines incident signal power at port 3. Reference receiver $R_3$ is connected to port 3 with directional coupler $C_{R3}$ therebetween and determines reflected signal power at port 3. Test receiver $T_4$ is connected to port 4 with directional coupler $C_{T4}$ therebetween and determines incident signal power at port 4. Reference receiver $R_4$ is connected to port 4 with directional coupler $C_{R4}$ therebetween and determines reflected signal power at port 4.

When TRL calibration is performed with network analyzer 300, information relating to calibration reference standards, the determined values of parameters of calibration reference standards, and systematic errors found from the determined values of these parameters are stored in memory 330. The information relating to calibration reference standards includes the amount of delay and property impedance of the through reference standard; the type, amount of delay and property impedance of the reflect reference standard; and the amount of delay, property impedance and two frequencies showing the frequency of use range of the line reference standards.

TABLE 1

Array structure of information relating to calibration reference standards

| Through reference standard: | Amount of delay, property impedance |
|---|---|
| Reflect reference standard: | Amount of delay, property impedance, type of reference standard |
| Line reference standard 1: | Amount of delay, property impedance, minimum frequency, maximum frequency |
| Line reference standard 2: | Amount of delay, property impedance, minimum frequency, maximum frequency |

The type of reflect reference standard is either an open reference standard or a short reference standard as previously mentioned. Moreover, the frequency range within which one line reference standard can be used is limited and therefore, in the present example, a broad frequency range is guaranteed by using two different line reference standards.

The most systematic errors present when a four-port device is determined using network analyzer 300 is 48 errors. The error value of 36 of 48 systematic errors can be found by TRL calibration. Again, the value of a systematic error is also called the error coefficient. The following error coefficients are included in the 36 error coefficients: directional [Ed], source matching [Es], and reflection tracking [Er], and load matching [El] and transmission tracking [Et] for a pair of two ports selected from the four ports. Network analyzer 300 performs determinations for multiple points within the determination frequency range and therefore, groups of 36 error coefficients corresponding to this number of determination frequency points are stored in memory 330.

TABLE 2

Array Structure of Error Coefficients

| Directional: | Ed [n] |
|---|---|
| Source matching: | Es [n] |
| Load matching: | El [n * n] |
| Reflection tracking: | Er [n] |
| Transmission tracking: | Et [n * n] |

(During n port calibration)

Furthermore, load matching and transmission tracking are stored in [N*N] arrays so that they can be easily referenced from the program.

In addition, it is necessary to determine 64 parameters of a calibration reference standard in order to find 36 error coefficients of one determination frequency point. The specifics are as follows:

Four S parameters, which are transmission coefficients and reflection coefficients determined at each port for each group when the through reference standard and line reference standard have been connected to 6 combinations of ports when two of four ports are selected. That is, the pairs of ports 1-2, ports 1-3, ports 1-4, ports 2-3, ports 2-4, or ports 3-4. Two parameters that are switch matching parameters determined with respect to each port of each pair when the through reference standard has been connected to the above-mentioned 6 types of port groups. One S parameter, which is a reflection coefficient determined at each port when the reflect reference standard has been connected to each of the 4 ports.

TABLE 3

Array Structure of Determination Parameters

| Through reference standard: | Thru [C] [4] |
|---|---|
| Reflect reference standard: | Reflect [n] |
| Line reference standard: | Line [C] [4] |
| Switch matching: | SwitchMatch [C] [2] |

(During n port calibration)

Here, C is a combination $nC_2$ of two selected from n number. Incidentally, as with the error coefficients, these groups of determination parameters are stored in memory 330 corresponding to the number of determination frequency points.

The procedure of processing the program for calibration with network analyzer 300 made as described above will now be described while referring to the flow chart in FIG. 5.

Figure 6:
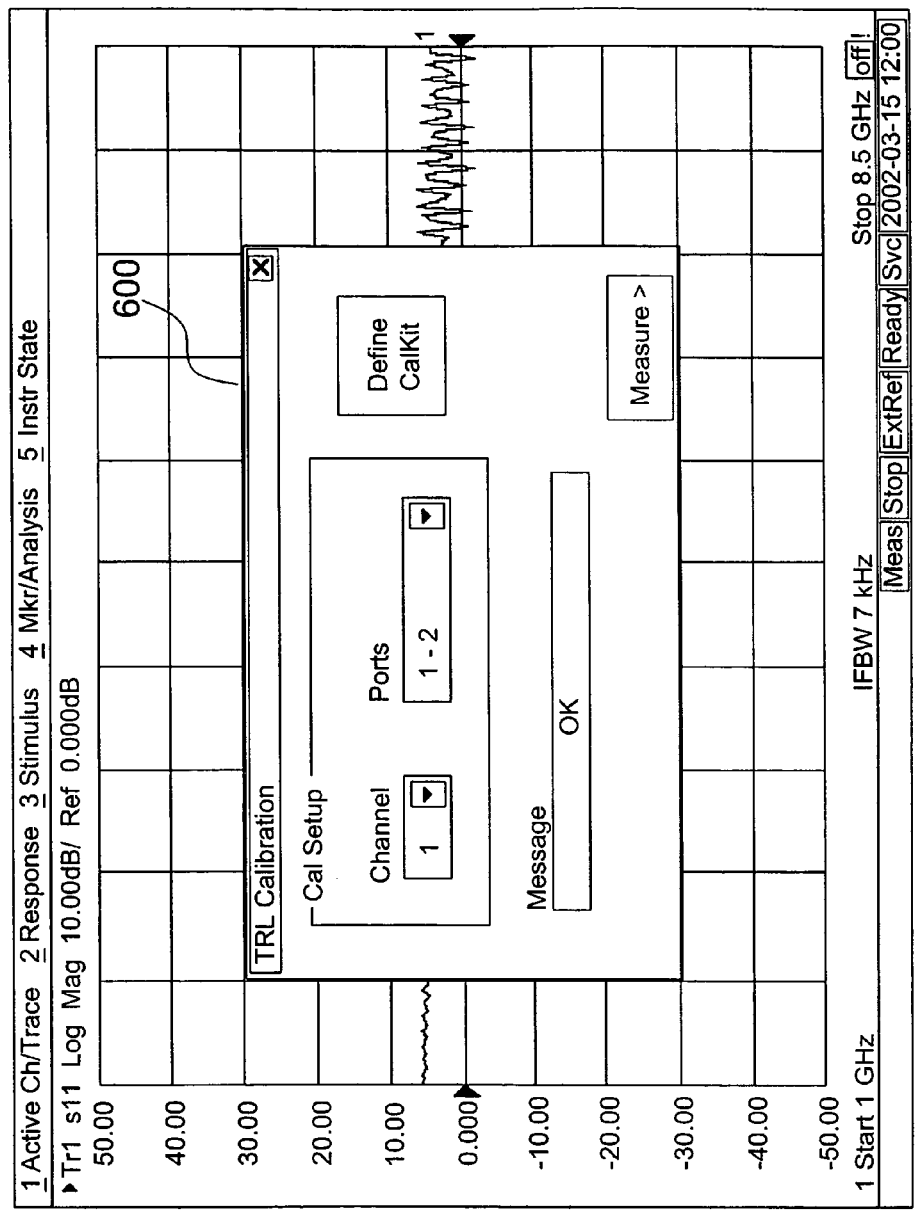
FIG. 6 is a drawing showing an exemplary screen displayed by the calibration program according to the method of the present invention.

In step P41, data are received from input device 340 and the information relating to the calibration reference standards that will be used for calibration are set. An example of the screen displayed by display 360 relating to step P41 is shown in FIG. 6. In FIG. 6, dialog box 600 comprises a list box for selecting the channel and port, a "Define Calkit" button for opening the setting dialog box of the calibration reference standard, a "Measure>" button for opening the determination dialog box for the calibration reference standard, and a message box. These buttons and list box, etc., are linked to a mouse that is connected to an input device and is operated by a pointer, etc., displayed on a screen by display 360. Network analyzer 300 can display multiple separate windows for displaying determination results. These windows are called channels in the present example. There are cases where the operator must calibrate the necessary port for each channel when displaying determination parameters that are different for each channel. Consequently, the channels and ports can be selected in dialog box 600. For instance, a number from 1 to 9 can be selected from the list for the channels. Moreover, the port, which is the calibration subject, is selected by selecting any pair of ports 1-2, 1-3, 1-4, 2-3, 2-4, or 3-4 when this number is 2, selecting any group of ports 1-2-3, 1-2-4, 1-3-4, or 2-3-4 when this number is 3, and selecting all ports when this number is 4.

Figure 7:
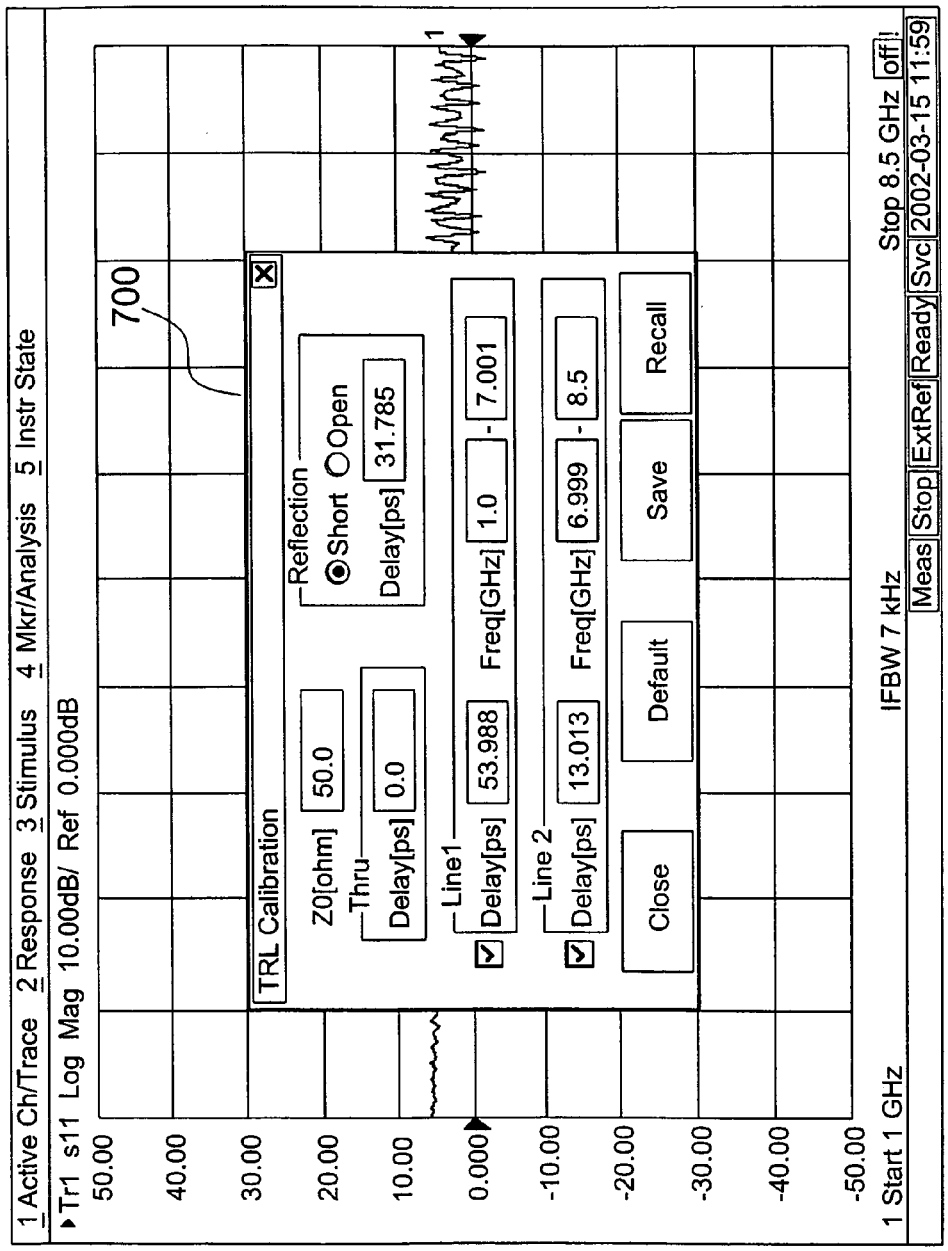
FIG. 7 is a drawing showing an exemplary screen displayed by the calibration program according to the method of the present invention.

The setting dialog box for the calibration reference standard, which is displayed by pushing the "define Calkit" box, is shown in FIG. 7. In FIG. 7, dialog box 700 comprises an input box, a radio button, and check boxes for setting information relating to calibration reference standards. It is not always necessary to use two line reference standards and therefore, the line reference standard that will be used can be selected with the check boxes.

With respect to the type of reflection reference standard, either the open reference standard or the short reference standard is selected with the radio button. Other setting information related to the calibration reference standard, such as the amount of delay, etc., is set by inputting numbers into the input box. Dialog box 700 has a "Save" button for storing information relating to the calibration reference standard in a storage medium, such as HDD 370, etc., and a recall button that recalls the setting information stored in the storage medium or a default button that recalls pre-determined settings. Once the settings are complete the information that was set in dialog box 700 is stored in memory 330 and dialog box 700 is closed by pushing "Close."

When information relating to the channel, port and calibration reference standard has been properly set, the characters "ok" are displayed in the message box and the "Measure>" button can be pushed. The "Measure>" button cannot be used until information relating to the calibration reference standard has been properly set. The channel and port selection details can be changed, but the "define Calkit" button cannot be used, even after the "ok" characters are displayed in the message box. When the "Measure>" button is pushed, the channel and port information that have been selected are stored in memory 330, dialog box 600 is closed, and processing proceeds to step P42.

Figure 8:
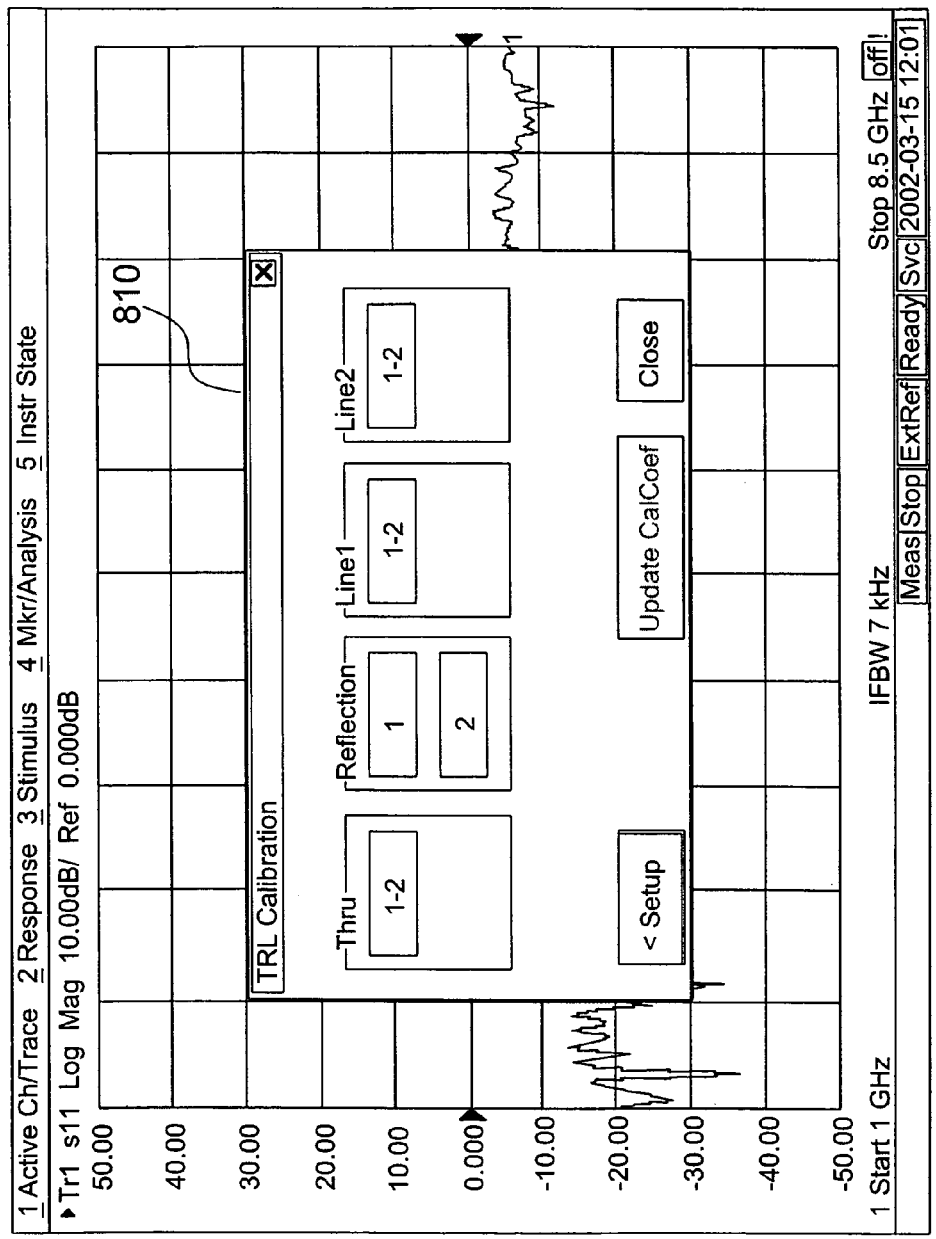
FIG. 8 is a drawing showing an exemplary screen displayed by the calibration program according to the method of the present invention.

In step P42, the dialog box relating to determination of the calibration reference standard is displayed by display 360 and this calibration reference standard is determined. An example of the screen displayed by display part 360 relating to step P42 is shown in FIG. 8. Dialog box 810 lists ports or groups of ports that are to be connected to the respective calibration reference standard based on the port that has been selected with dialog box 600. As becomes clear when referring to the dialog boxes in FIGS. 6 and 7, network analyzer 300 is set so that two-port calibration between ports 1 and 2 is performed at a determination frequency range of 1.0 to 8.5 GHz. Therefore, port 1 or port 2 or ports 1-2 are indicated in the group of calibration reference standards in dialog box 810 as the ports that are to be connected. For instance, two buttons are displayed in the "Reflection" box, which shows the connection of the reflect reference standard, and the respective number that stands for the port no., either [1] or [2], is displayed. For instance, when the reflect reference standard is connected to port 1 and button [1] of the "Reflection" box is pushed, the determination of the reflect reference standard is performed at port 1 and the determined value is stored in memory 330. A button that displays the port or group of ports to which another calibration reference standard is to be connected is given for another group of calibration reference standards. The color of these buttons changes when these buttons are pushed and the related determination has been completed.

Figure 9:
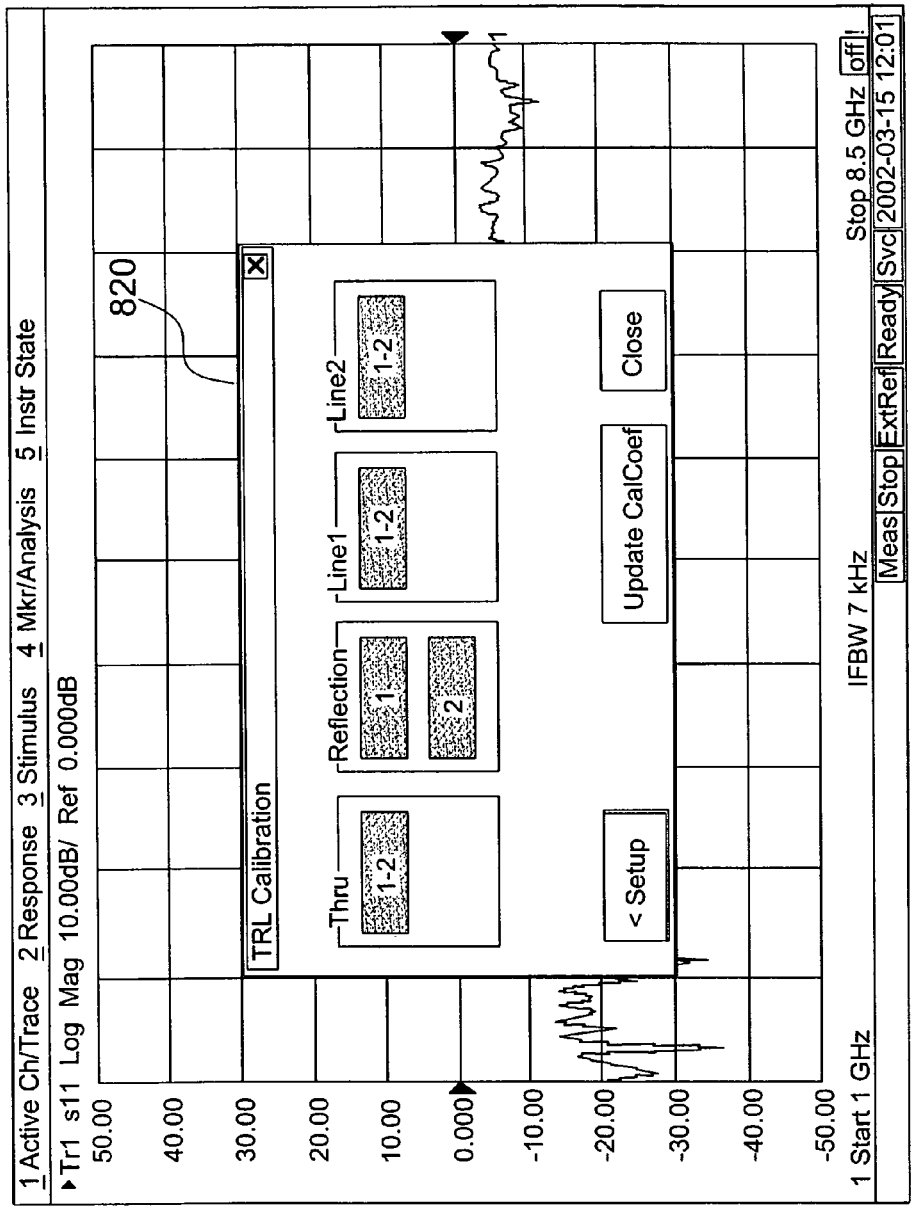
FIG. 9 is a drawing showing an exemplary screen displayed by the calibration program according to the method of the present invention.

In step P43, evaluation and branch processing are performed in order to continue the processing in step P42 until all determinations necessary for calibration are completed. Dialog box 810 has the "Update CalCoef" button for finding the error coefficient and reflecting this in the removal of the effects of errors in subsequent determinations. This button can be pushed when all determinations necessary for calibration are completed. Furthermore, the color of all of the buttons listed in each group of calibration reference standards in dialog box 810 changes when all determinations are completed. This type of dialog box is shown in FIG. 9. The "Update CalCoef" button cannot be used until all determinations necessary for calibration have been completed.

Dialog box 810 has a "Close" button and therefore, the calibration operation can be interrupted. When the calibration operation is interrupted, channel and port selection information and information on settings for calibration reference standards are saved and determined values obtained before interruption are all erased. Moreover, dialog box 810 has a "<Setup" button and therefore, it is possible to re-select the channels and ports or re-set the information relating to the calibration reference standards. The determined values of parameters of the calibration reference standards and colors of the buttons are not initialized or changed, even if re-selection or re-setting are performed.

Now, when the "Update CalCoef" button is pushed, program processing proceeds to step P44.

In step P44, CPU 320 calculates the error coefficients while referring to the determined values of parameters that have been stored in memory 330 and stores these coefficients in memory 330. That is, the systematic errors are found. In step P45, CPU 320 outputs the determined values of desired parameters from which the effects of the error have been removed to display 360 while referring to the error coefficients that have been stored in memory 330 and the determined values obtained from determination part 350. The error that will be removed in the short term also includes a drift error.

Figure 10:
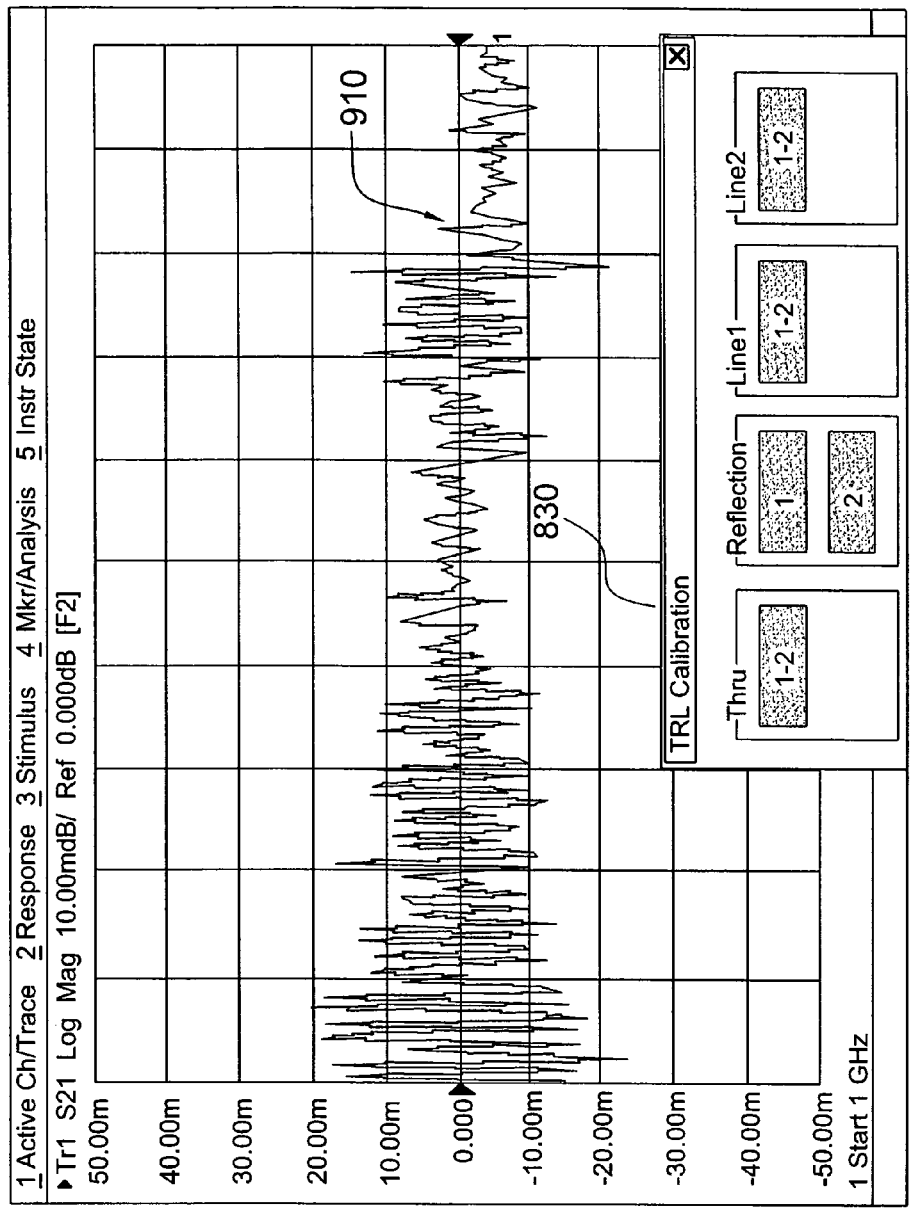
FIG. 10 is a drawing showing an exemplary screen displayed by the calibration program according to the method of the present invention.
Figure 11:
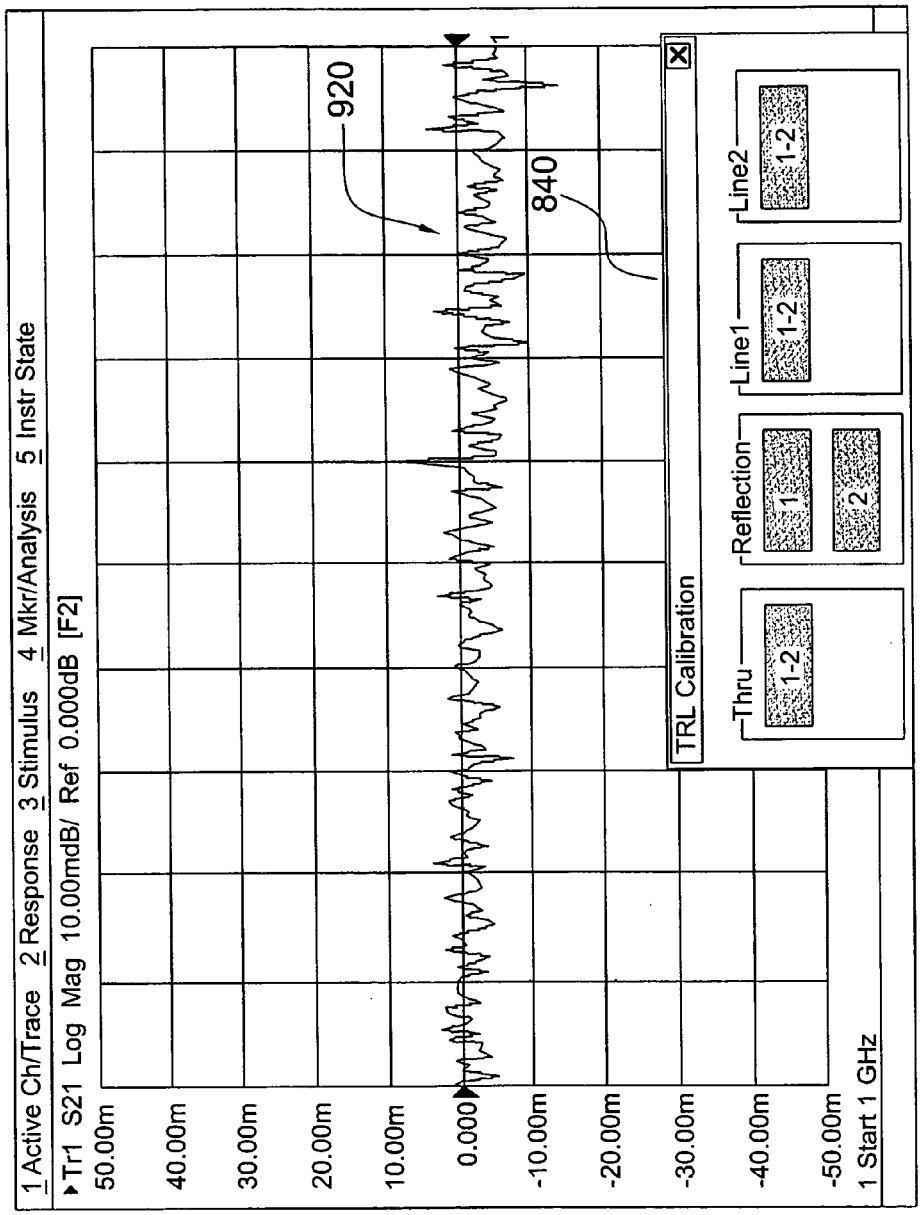
FIG. 11 is a drawing showing an exemplary screen displayed by the calibration program according to the method of the present invention.

Examples of output of display 360 are shown in FIGS. 10 and 11. Result 910 of the determination of a desired parameter when the error coefficient cannot be reliably found is shown in FIG. 10. On the other hand, result 920 of the determination of the desired parameter when the error coefficient can be reliably found is shown in FIG. 11. Both determination results 910 and 920 are results of the determination of the transmission coefficient S21 from port 1 to port 2 when the through reference standard has been connected between port 1 and port 2. Whether or not the error coefficient found is valid can be evaluated, for instance, by observing the amplitude of the determination results (step P45).

As is clear from FIG. 10 or FIG. 11, the dialog box for determining the calibration reference standard also displays the determination results and therefore, it is possible to re-determine only the desired parameter from among the parameters of calibration reference standards that have already been determined. For instance, if the error coefficient that has been found is incorrect, a button displaying the port no. that is listed in dialog box 830 is selected and the desired parameter of the calibration reference standard can be re-determined so that the determination results in FIG. 11 can be obtained. As with the dialog box in FIG. 9, dialog box 830 has an "Update CalCoef" button and therefore, when the "Update CalCoef" button is pushed after re-determination, a new error coefficient is found and determination results that reflect this error coefficient are displayed.

Figure 5:
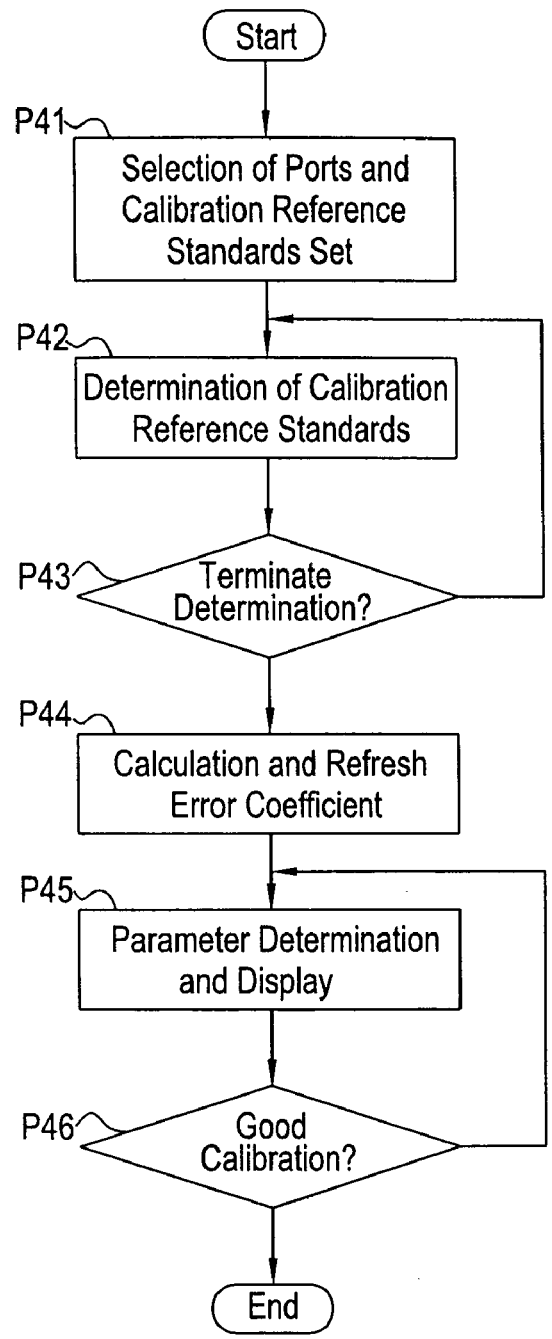
FIG. 5 is a flow chart showing the calibration procedure by the method of the present invention.

When the calibration program described in detail above using the flow chart in FIG. 5 is processed, the results of determining the desired parameter as indicated at that time are displayed in the background of the dialog box that is displayed and as with ordinary determinations, the desired parameter can be indicated or the pattern used to display the results of determining this parameter can be changed during the processing of the same program. For instance, when the determination results are displayed in a window displayed in display 360, they can be displayed with a waveform or numbers that display a list or in another form, or the scroll bar of the window can also be operated when the determination results are displayed in a list. Other settings relating to the determinations can be changed during the processing of the calibration program.

Dialog box 840 in FIG. 11 is the same as dialog box 830 in FIG. 10 and has a "Close" button. Therefore, if it is judged that the error coefficient that has been found is valid, calibration can be terminated by pushing this "Close" button. The channel and port selection information and information on setting the calibration reference standards are retained, even if calibration is terminated, but all determined values obtained before termination will be erased.

Now, as previously mentioned, dialog box 810 has a "<Setup" button and therefore, it is possible to re-select the channels and ports or to re-set the information relating to the calibration reference criteria, and the determined values of the parameters of the calibration reference standards and colors of the buttons will not be initialized or changed, even if re-selection or re-setting is performed. This is important to improving calibration operation efficiency because it makes it possible to divide n port calibrations into multiple two-port calibrations that can be performed in steps.

For example, in the case of three-port calibration of ports 1-2-3, it is possible to switch between two-port calibration for ports 1-2 and two-port calibration for ports 1-3 during the three-port calibration of ports 1-2-3. When compared to 3-port calibration, the factors that affect the results of determining calibration reference standards, such as the connected ports and connection status of the calibration reference standards, etc., are limited with 2-port calibration, and therefore, it is easier to confirm whether or not an error coefficient found is valid and to respond if the error coefficient found is invalid.

As long as the above-mentioned calibration program is stored on a recording medium so that network analyzer 300 can execute this program, this recording medium can be presented separate from network analyzer 300, even if it is housed in network analyzer 300. For instance, it is possible to record this program on a storage medium such as a CDROM, floppy disk, memory card, external HDD, etc., and load the program from this storage medium into network analyzer 300. Moreover, it is, of course, possible to record this program on a ROM and load it into network analyzer 300.

By means of the present invention that was described above in detail, it is possible to reduce the number of processes when re-determination of calibration reference standards is necessary by outputting the determined values of desired parameters from which the effects of error have been removed during calibration work.

Moreover, it is also possible to prevent waste of memory resources in which determined values of the parameters of calibration reference standards are stored and to prevent workers from being confused by the co-existence of newly determined values and old determined values when calibration is performed again by rendering the determined values of the parameters of calibration reference standards unusable when calibration is interrupted or terminated.

Furthermore, it is possible to easily verify error coefficients obtained by calibration and respond when poor error coefficients are obtained when N number of the above-mentioned determination terminals are to be calibrated by calibrating determination terminals for each combination of determination terminals obtained by selecting M number of determination terminals less than the N from N number of the above-mentioned determination terminals.

What is claimed is:

1. A determination apparatus comprising:
a determination device having a plurality of determination terminals;
a controller for selecting at least one of said plurality of determination terminals, determining a calibration reference standard, and setting of a property value of said determined calibration reference standard; and
a memory for storing a parameter of said determined calibration reference standard and a determined value for said parameter as determined by said determination device;
wherein said determination device determines an error of said determined value of said parameter, said error being stored in said memory, said determination device outputting said determined value after removing an effect of said error therefrom, and obtaining and storing a re-determined value for said parameter while maintaining said determined value of said parameter of said calibration reference standard in said memory.

2. The device in claim 1, wherein said determination device stores said re-determined value for said parameter in said memory, while maintaining said property value of said determined calibration reference standard in said memory.

3. The device in claim 1, wherein said controller renders unusable said determined value of said parameter of said calibration reference standard in said memory.

4. The device in claim 1, wherein said determination device is a network analyzer having two or more determination terminals.

5. A method of calibrating a determination apparatus having determination terminals and a memory using a calibration reference standard, said method comprising:
selecting at least one of said determination terminals and a calibration reference standard;
setting a property value of said selected calibration reference standard;
selecting a parameter of said calibration reference standard;
storing a determined value of said parameter of said calibration reference standard in said memory;
referencing said determined value of said parameter of said calibration reference standard stored in said memory;
determining an error of said determined value of said parameter;
outputting said determined value after removing an effect of said error;
re-determining a value for said parameter of said calibration reference standard; and
storing said re-determined value in said memory while maintaining said determined value of said parameter of said calibration reference standard in said memory.

6. The method in claim 5, further comprising the step of:
reselecting a desired parameter of said calibration reference standard; and storing a re-determined value of said desired parameter in said memory while maintaining said determined values of said parameter of said calibration reference standard in said memory.

7. The method in claim 5, further comprising:
rendering said determined values of said parameter of said calibration reference standard in said memory unusable when any of the method steps are interrupted or terminated.

8. A method of calibrating a determination apparatus having a plurality of determination terminals using a calibration reference standard, said method comprising:
selecting at least one of said determination terminals and a calibration reference standard;
setting a property value of said calibration reference standard;
selecting a parameter of said calibration reference standard; referencing a determined value of said parameter stored in a memory;
determining an error of said determined value;
outputting said determined value after removing an effect of said error;
re-determining a value for said parameter; and
storing said re-determined value in said memory while maintaining said determined value in said memory wherein when calibrating a number N of said determination terminals, a determination apparatus calibrates a pre-selected number of determination terminals for each combination of said determination terminals obtained by selecting a number M of determination terminals from said N determination terminals, wherein M is less than N.

9. The method in claim 8, wherein said determination apparatus is a network analyzer having at least two or more determination terminals.

10. A computer readable medium having computer readable program instructions embodied thereon for controlling calibration of a determination apparatus comprising determination terminals and memory using a calibration reference standard, said computer readable medium comprising:
program instructions for selecting said determination terminals and a calibration reference standard;
program instructions for setting a property value of said calibration reference standard;
program instructions for determining a value of a parameter of said calibration reference standard;
program instructions for storing said determined value in said memory;
program instructions for referencing said determined value stored in said memory;
program instructions for determining an error from said referenced determined value;
program instructions for outputting said determined value after removing an effect of said error;
program instructions for re-determining a value of said parameter; and
program instructions for storing said re-determined value in said memory while maintaining said determined value in said memory.

11. The computer readable medium in claim 10, further comprising:
program instructions for rending unusable said determined value in said memory when any steps are interrupted or terminated.

12. A computer readable medium having a computer readable program instructions embodied thereon for controlling calibration of a determination apparatus comprising determination terminals and memory using a calibration reference standard, said computer readable medium comprising:
program instructions for selecting said determination terminals and a calibration reference standard;
program instructions for setting a property value of said calibration reference standard;
program instructions for determining a value of a parameter of said calibration reference standard;
program instructions for storing said determined value in said memory;
program instructions for referencing said determined value stored in said memory;
program instructions for determining an error from said referenced determined value;
program instructions for outputting said determined value removing an effect of said error;
program instructions for re-determining a value of said parameter; and
program instructions for storing said re-determined value in said memory while maintaining said determined values, wherein when calibrating a number N of said determination terminals, and calibrating said determination terminals of the determination apparatus for each combination of said determination terminals obtained by selecting a number M of determination terminals from said N determination terminals, wherein M is less than N.

* * * * *